United States Patent [19]

Sandera

[11] 4,250,213

[45] Feb. 10, 1981

[54] UV-LIGHT-SENSITIVE SHEET FOR GRAPHIC APPLICATIONS

[75] Inventor: Ladislav Sandera, Schaffhausen, Switzerland

[73] Assignee: Swiss Aluminium Ltd., Chippis, Switzerland

[21] Appl. No.: 52,839

[22] Filed: Jun. 28, 1979

Related U.S. Application Data

[62] Division of Ser. No. 893,897, Apr. 6, 1978, Pat. No. 4,197,354.

[30] Foreign Application Priority Data

Apr. 18, 1977 [CH] Switzerland ........................ 4754/77

[51] Int. Cl.[3] ............................................ B32B 15/08

[52] U.S. Cl. .................................... 427/409; 250/372; 428/207; 428/461; 428/463; 428/469; 428/913

[58] Field of Search ........................ 427/409; 250/372; 428/461, 463, 913, 469, 207

[56] References Cited

U.S. PATENT DOCUMENTS 4,131,518 12/1978 Fromson ......................... 428/461 X 4,148,967 4/1979 Satoh et al. ...................... 428/463 X

*Primary Examiner*—Thomas J. Herbert, Jr.

*Attorney, Agent, or Firm*—Robert H. Bachman

[57] ABSTRACT

A UV-light-sensitive sheet for graphic applications comprises an aluminum sheet or foil bearing an oxide film which is produced by anodizing and is colored but not yet sealed, an intermediate layer, and a layer of UV-light-sensitive plastic. The intermediate layer is formed from a solution containing at least one copolymer which is soluble in polar solvents and is made up of a monomer of the following group:

(A) unsaturated ethers, unsaturated alcohols, unsaturated amines, unsaturated ketones, styrene and a monomer of the group (B) unsaturated carboxylic acids, carboxylic acid salts unsaturated carboxylic acid derivatives which can be hydrolyzed.

The intermediate layer is formed on the colored, non-sealed oxide layer, dried and then a UV-light-sensitive layer of plastic is deposited on top of the intermediate layer.

6 Claims, No Drawings

UV-LIGHT-SENSITIVE SHEET FOR GRAPHIC APPLICATIONS

This is a division of application Ser. No. 893,897, filed Apr. 6, 1978, now U.S. Pat. No. 4,197,354.

The invention concerns a UV-light-sensitive sheet which is suitable for graphic application and comprises an aluminum sheet or foil bearing a colored anodic oxide layer which is not sealed, an intermediate layer and a light-sensitive plastic layer, and concerns too a process for manufacturing the said sheet.

In the graphic industry there are many well known methods for producing patterns, lettering and the like on anodized aluminum. In principle contrast can be achieved in the following ways:

etching away locally the colored oxide layer (the contrast is formed by the colored aluminum oxide layer and the blank aluminum)

etching away locally an anodized aluminum foil mounted on a plastic foil, until the colored background is exposed partial removal of color by oxidizing the coloring substance in the pores.

The removal of color from the oxide layer—known as a bleaching process—offers a number of advantages over the other, alternative methods e.g. good corrosion resistance, more economic, and better resolution of the image (no relief). There are in principle two different methods for carrying out this kind of process:

The offset printing method is used extensively for large series production.

For small series use is made of the photo resist lacquer method, which is also well known.

The photo resist lacquer method involves the exposure of a UV-light-sensitive plastic layer on the colored, unsealed aluminum oxide layer, through a template which is a negative of the pattern to be produced. The colored aluminum oxide layer is then bleached at the exposed or unexposed places by applying dilute nitric or sulphuric acid containing an oxidizing agent. The bleaching process is usually carried out shortly after coloring the aluminum oxide layer. The sheet should not be stored for a long time after coloring as the pores are gradually sealed up by the moisture in the air. It will be appreciated therefore that storage impairs the bleaching process, since the oxide layer can be bleached completely, only if the oxidizing agent has free access to the coloring substance in the pores. Another difficulty is that UV-light-sensitive plastic tends to block the pores thus preventing the oxidizing agent from having easy access to the coloring substance.

There are already a number of processes available to prevent this self-sealing effect occurring during storage, the structure of the layer material also being such that the photo resist lacquer is prevented from penetrating the pores, so that the lacquer layer can be removed completely at the exposed sites. While the self-sealing effect can be prevented by using an almost pore-free photo-lacquer layer, the problem of lacquer penetrating the pores is solved by means of the so-called barrier layer method. This method is based on the provision of a very thin, water-soluble intermediate layer between the aluminum oxide and the layer of photo resist lacquer.

This intermediate layer is not attacked during the development of the PR layer. In the subsequent rinsing stage a jet of water or sponge soaked in water is used to dissolve this intermediate layer, thus allowing the oxidizing agent applied in the next stage to have easy access to the color particles in the pores to be bleached.

This barrier layer can be formed using various derivatives such as, for example, gelatines, glues, dextrines and other substances. In particular however, because of the need to be able to store the coated sheet for long times, carboxymethylcellulose (CMC) has been used extensively in practice.

This substance, which has a high molecular weight, is made up to glucose rings joined together in a chain-like manner, with the hydrogen of the hydroxyl groups replaced by the sodium salt of a short-chain carboxylic acid. In practice carboxymethylcellulose is used in the form of colloidal solutions in polar solvents. However the CMC particles tend to form lumps in polar solvents, which makes the handling of this substance difficult in production. Special methods of mixing have to be employed, making it necessary to use high speed mixers or ultrasonic probes. A further disadvantage is that the solution is not very stable. Like all natural substances CMC is broken down by various micro-organisms. This decomposition then leads to hydrolysis and consequently to the precipitation of products from the hydrolysis of CMC. Depolymerization and decomposition of carboxy groups impair the effectiveness of the solution in a short time to such an extent that barrier layers, made from solutions which have not been freshly prepared, do not function properly with the result that the subsequent bleaching process is incomplete or does not even take place at all. There is also the danger that micro-organisms carried over from the solution attack the barrier layer itself and impair its functioning.

The object of the present invention is to propose a replacement for the carboxymethylcellulose and involves a solution which is easy to prepare, has good storage properties and forms a barrier layer which is at least as good as the carboxymethylcellulose.

The object is solved by way of the invention in that at least one copolymer which is soluble in polar solvents and is made up of a monomer listed in the following group and soluble in polar solvents is used, (A) unsaturated ethers
unsaturated alcohols
unsaturated amines
unsaturated ketones
styrene and a monomer of the group (B) unsaturated carboxylic acids or carboxylic acid salts
unsaturated carboxylic acid derivatives which can be hydrolyzed, to form, from a solution, the intermediate layer on the anodic, colored, but non-sealed oxide layer, after which this intermediate layer is dried and the sheet is coated with a UV-light-sensitive plastic on top of the said intermediate layer.

The term "polar solvent" should be taken to mean here e.g. water, methanol, ethanol etc.

Acrylic acid and methacrylic acid or their alkali salts are the preferred forms of carboxylic acid or carboxylic acid salts respectively.

It has also been found advantageous to use the anhydrides as polymerizable carboxylic acid derivatives. Maleic acid anhydride has been found to be particularly suitable.

Likewise it has been found advantageous to employ vinylmethylether as the unsaturated ether, vinylalcohol as the unsaturated alcohol, and vinylmethylketone as the unsaturated ketone.

The use of the copolymers of the invention exhibit a number of decisive advantages over carboxymethylcellulose viz., Since the copolymers used are soluble in polar solvent it is no longer necessary to use expensive mixing methods in industrial applications.

The stability of the copolymer-containing solutions of the invention is considerably better, since there is no naturally occurring substances involved and therefore no tendency for decomposition by micro-organisms.

In contrast to carboxymethylcellulose these substances have pronounced adhesive characteristics due to the higher number of carboxygroups. The result is that much lower concentrations can be used. This also has a positive effect on the processing of the sheet in that it prevents the bleaching solution from coming between the colored oxide and the photo sensitive lacquer by dissolving the intermediate layer.

The invention will now be explained in greater detail with the help of two examples.

EXAMPLE 1

An aluminum foil (99.5% Al) was anodically oxidized in the conventional manner using direct current and a 15% sulphuric acid electrolyte, and then colored black (color compound MLW from Sandoz AG, Basel, 30 g/l, pH=4.7, t=10 min., T=40°-60° C.). The dried samples were cut into two equal sized pieces. One half was immersed in a freshly prepared solution, the other half in a two week old aqueous solution, both solutions containing 1.3 g/l of a hydrolyzed copolymer of vinylmethylether and maleic acid anhydride (S-95, GAF product). After drying, the samples were coated with photo resist lacquer PR4 (Kodak) and then dried. After storing at room temperature for 12 months, these samples were processed as follows:

The samples were illuminated through a negative using UV light and the non-polymerized lacquer at the unexposed places removed by dissolving in a mixture of trichlorethylene and trichlorethane (1:1). The last particles of the soft photo laquer layer were removed during the removal of the intermediate layer (barrier layer), which was done by water jetting, so that the oxide layer at these sites could then be readily bleached by treating the sheet for 5 min with 10% sulphuric acid containing 15% potassium permanganate. The hardened parts of the PR layer were then removed by immersion in methylchloride, and the rest of the barrier layer by subsequently treating with water. Finally the oxide layers were sealed in water in the normal manner.

No differences could be found between the two samples, neither in the processing of the sheets nor in the quality of pattern.

EXAMPLE 2

A laminate of a 50 μm thick aluminum foil on a 220 μm thick PVC foil was anodized in an identical manner to that described in example No. 1, and then colored and cut into two equal sized pieces. The colored and dried samples were immersed for 7 seconds one piece in a freshly prepared solution, the other in a 3 week old methanol based solution, both solutions containing 1.8 g/l of the hydrolyzed copolymer of styrene and maleic acid anhydride (Lytron, UNION CARBIDE). After drying and coating with photo resist lacquer PR4 (Kodak), the sheets were stored at room temperature for 12 months. The processing of the sheet samples was as in example No. 1 with the exception that the intermediate layer was removed using a sponge which had been soaked in water.

No difference could be found between the two samples, neither in processing behavior nor in image quality.

What is claimed is:

1. A process for producing a UV-light-sensitive sheet for graphic applications comprising a first layer of an aluminum sheet or foil bearing a second layer of an anodized, unsealed and colored oxide film, an intermediate third layer on said second layer, and a fourth layer of UV-light-sensitive plastic on said intermediate layer, in which the intermediate layer is formed from a solution containing at least on copolymer which is soluble in polar solvents and is made up of a monomer listed in the following group:

(A) unsaturated ethers
unsaturated alcohols
unsaturated amines
unsaturated ketones
styrene and a monomer of the group (B) unsaturated carboxylic acids, carboxylic acid salts, unsaturated carboxylic acid derivatives which can be hydrolyzed, including the steps of forming the said intermediate layer on the anodized, unsealed and colored oxide layer, followed by drying the said intermediate layer, followed by depositing a UV-light-sensitive plastic layer on the intermediate layer.

2. A process according to claim 1 in which a copolymer of vinylmethylether and maleic acid anhydride is used to form the intermediate layer.

3. A process according to claim 1 in which a copolymer of vinylalcohol and methacrylic acid is used to form the intermediate layer.

4. A process according to claim 1 in which a copolymer of methylvinylketone and maleic acid anhydride is used to form the intermediate layer.

5. A process according to claim 1 in which a copolymer of styrene and maleic acid anhydride is used to form the intermediate layer.

6. A process according to claim 1 in which a copolymer of vinylamine and acrylic acid is used to form the intermediate layer.

* * * * *

UNITED STATES PATENT AND TRADEMARK OFFICE

CERTIFICATE OF CORRECTION

PATENT NO. : 4,250,213

DATED : February 10, 1981

INVENTOR(S) : Ladislav Sandera

It is certified that error appears in the above-identified patent and that said Letters Patent are hereby corrected as shown below:

In Column 2, line 11, change "to" to read ---of---.

In Column 3, line 59, change "differences" to read ---difference---.

In Column 4, line 29, claim 1, change "on" to read ---one---.

Signed and Sealed this

*Twenty-eighth* Day of *April 1981*

[SEAL]

*Attest:*

RENE D. TEGTMEYER

*Attesting Officer* *Acting Commissioner of Patents and Trademarks*